US012724346B2

(12) United States Patent
Lee et al.

(10) Patent No.: US 12,724,346 B2
(45) Date of Patent: Sep. 1, 2026

(54) UNDERLAYER COMPOUND FOR PHOTOLITHOGRAPHY, MULTILAYERED STRUCTURE FORMED USING THE SAME, AND METHOD FOR MANUFACTURING SEMICONDUCTOR DEVICES USING THE SAME

(71) Applicant: Inha University Research and Business Foundation, Incheon (KR)

(72) Inventors: Jinkyun Lee, Incheon (KR); Yejin Ku, Incheon (KR); Gayoung Kim, Hwaseong-si (KR)

(73) Assignee: Inha University Research and Business Foundation, Incheon (KR)

(*) Notice: Subject to any disclaimer, the term of this patent is extended or adjusted under 35 U.S.C. 154(b) by 785 days.

(21) Appl. No.: 18/307,454

(22) Filed: Apr. 26, 2023

(65) Prior Publication Data

US 2023/0375927 A1 Nov. 23, 2023

(30) Foreign Application Priority Data

May 17, 2022 (KR) ........................ 10-2022-0060028
Feb. 27, 2023 (KR) ........................ 10-2023-0026138

(51) Int. Cl.

| | |
|---|---|
| ***G03F 7/038*** | (2006.01) |
| ***G03F 7/004*** | (2006.01) |
| ***G03F 7/11*** | (2006.01) |
| ***H10P 50/00*** | (2026.01) |
| ***H10P 76/20*** | (2026.01) |

(52) U.S. Cl.

CPC .......... *G03F 7/0387* (2013.01); *G03F 7/0043* (2013.01); *G03F 7/11* (2013.01); *H10P 50/692* (2026.01); *H10P 50/694* (2026.01); *H10P 50/695* (2026.01); *H10P 50/696* (2026.01); *H10P 50/71* (2026.01); *H10P 50/73* (2026.01); *H10P 76/2042* (2026.01)

(58) Field of Classification Search

CPC ........ G03F 7/0387; G03F 7/0043; G03F 7/11; G03F 7/091; G03F 7/094; H10P 50/692; H10P 50/694; H10P 50/695; H10P 50/696; H10P 50/71; H10P 50/73; H10P 76/2042

USPC ............. 430/311, 270.1, 271.1, 272.1, 273.1

See application file for complete search history.

(56) References Cited

U.S. PATENT DOCUMENTS

| | | | |
|---|---|---|---|
| 8,257,910 | B1 | 9/2012 | Guerrero et al. |
| 8,968,989 | B2 | 3/2015 | Ouattara et al. |
| 9,005,873 | B2 | 4/2015 | Sakamoto et al. |
| 9,240,327 | B2 | 1/2016 | Sakamoto et al. |
| 9,328,198 | B2 | 5/2016 | Nakasugi et al. |
| 9,337,052 | B2 | 5/2016 | Shigaki et al. |
| 9,627,217 | B2 | 4/2017 | Shigaki et al. |

(Continued)

FOREIGN PATENT DOCUMENTS

| | | | |
|---|---|---|---|
| CN | 106662820 | A | 5/2017 |
| CN | 106662821 | A | 5/2017 |

(Continued)

*Primary Examiner* — Caleen O Sullivan

(74) *Attorney, Agent, or Firm* — Harness, Dickey & Pierce, P.L.C.

(57) ABSTRACT

Provided is an underlayer compound, which improves the resolution and sensitivity of a photoresist layer, restrains the collapse of a photoresist pattern and has improved etching resistance. The underlayer compound includes an alternating copolymer including a repeating unit represented by Formula 1, or an alkylated tin oxide nanocluster having a counter anion.

20 Claims, 10 Drawing Sheets

(56) References Cited

U.S. PATENT DOCUMENTS

| | | | |
|---|---|---|---|
| 9,891,524 | B2 | 2/2018 | Shiobara |
| 10,042,255 | B2 | 8/2018 | Zhou et al. |
| 10,082,735 | B2 | 9/2018 | Shibayama et al. |
| 10,109,485 | B2 | 10/2018 | Ogihara et al. |
| 10,242,871 | B2 | 3/2019 | Nishita et al. |
| 10,613,440 | B2 | 4/2020 | Shibayama et al. |
| 10,795,261 | B2 | 10/2020 | Nishita et al. |
| 11,022,884 | B2 | 6/2021 | Shibayama et al. |
| 11,031,244 | B2 | 6/2021 | Singhal et al. |
| 11,079,676 | B2 | 8/2021 | Asano et al. |
| 11,361,967 | B2 | 6/2022 | Liang et al. |
| 2014/0193757 | A1 | 7/2014 | Ogihara et al. |
| 2019/0227438 | A1 | 7/2019 | Nishita et al. |
| 2019/0385837 | A1 | 12/2019 | Chacko et al. |
| 2020/0124965 | A1 | 4/2020 | Nishita et al. |
| 2020/0133126 | A1 | 4/2020 | Sim et al. |
| 2020/0159120 | A1 | 5/2020 | Ogihara et al. |
| 2021/0011383 | A1 | 1/2021 | Cardineau et al. |
| 2021/0088908 | A1 | 3/2021 | Kai et al. |
| 2021/0124266 | A1 | 4/2021 | Shigaki et al. |
| 2021/0200093 | A1 | 7/2021 | Park et al. |
| 2021/0240082 | A1 | 8/2021 | Baek et al. |
| 2021/0311394 | A1 | 10/2021 | Gädda et al. |
| 2021/0375616 | A1 | 12/2021 | Krysak et al. |
| 2021/0395462 | A1 | 12/2021 | Shibayama et al. |
| 2022/0179317 | A1 | 6/2022 | Kori et al. |
| 2022/0187709 | A1 | 6/2022 | Shibayama et al. |
| 2022/0283501 | A1 | 9/2022 | Ogata et al. |
| 2023/0400764 | A1 | 12/2023 | Lee et al. |
| 2024/0027910 | A1 | 1/2024 | Lee et al. |

FOREIGN PATENT DOCUMENTS

| | | | |
|---|---|---|---|
| CN | 107111234 | A | 8/2017 |
| JP | 2015-081248 | A | 4/2015 |
| JP | 2019-053305 | A | 4/2019 |
| JP | 2021-109962 | A | 8/2021 |
| JP | 2021-124726 | A | 8/2021 |
| JP | 2021-534584 | A | 12/2021 |
| KR | 10-2013-0034617 | A | 4/2013 |
| KR | 10-2014-0090111 | A | 7/2014 |
| KR | 10-2015-0047437 | A | 5/2015 |
| KR | 10-2017-0031086 | A | 3/2017 |
| KR | 10-2017-0033265 | A | 3/2017 |
| KR | 10-2017-0054246 | A | 5/2017 |
| KR | 101739325 | B1 | 5/2017 |
| KR | 10-2017-0070017 | A | 6/2017 |
| KR | 101901522 | B1 | 9/2018 |
| KR | 101943023 | B1 | 1/2019 |
| KR | 10-2019-0051951 | A | 5/2019 |
| KR | 10-2019-0099428 | A | 8/2019 |
| KR | 102006277 | B1 | 8/2019 |
| KR | 10-2019-0113745 | A | 10/2019 |
| KR | 102044968 | B1 | 12/2019 |
| KR | 102061919 | B1 | 1/2020 |
| KR | 10-2020-0049660 | A | 5/2020 |
| KR | 102112383 | B1 | 5/2020 |
| KR | 10-2020-0143675 | A | 12/2020 |
| KR | 10-2021-0010587 | A | 1/2021 |
| KR | 10-2021-0033058 | A | 3/2021 |
| KR | 10-2021-0033922 | A | 3/2021 |
| KR | 10-2021-0042959 | A | 4/2021 |
| KR | 10-2021-0082177 | A | 7/2021 |
| KR | 10-2021-0086485 | A | 7/2021 |
| KR | 10-2021-0097977 | A | 8/2021 |
| KR | 102307204 | B1 | 10/2021 |
| KR | 102316373 | B1 | 10/2021 |
| KR | 10-2021-0149744 | A | 12/2021 |
| KR | 102361878 | B1 | 2/2022 |
| KR | 10-2022-0035149 | A | 3/2022 |
| KR | 10-2022-0042311 | A | 4/2022 |
| KR | 10-2022-0051847 | A | 4/2022 |
| KR | 102398530 | B1 | 5/2022 |
| KR | 10-2022-0081287 | A | 6/2022 |
| KR | 102458068 | B1 | 10/2022 |
| KR | 10-2023-0172078 | A | 12/2023 |
| KR | 10-2024-0010670 | A | 1/2024 |
| WO | WO-2021/202198 | A1 | 10/2021 |

132
140
130
124
122
120
110
100

UNDERLAYER COMPOUND FOR PHOTOLITHOGRAPHY, MULTILAYERED STRUCTURE FORMED USING THE SAME, AND METHOD FOR MANUFACTURING SEMICONDUCTOR DEVICES USING THE SAME

CROSS-REFERENCE TO RELATED APPLICATIONS

This U.S. non-provisional patent application claims priority under 35 U.S.C. § 119 of Korean Patent Application Nos. 10-2022-0060028, filed on May 17, 2022, and 10-2023-0026138, filed on Feb. 27, 2023, the entire contents of which are hereby incorporated by reference.

BACKGROUND

The present disclosure herein relates to an underlayer compound for photolithography used for the manufacture of a semiconductor device, a multilayered structure formed using the same, and a method for manufacturing a semiconductor device using the same.

This study was conducted with the support of Samsung Science & Technology Foundation (project number: SRFC-TA1703-51).

Photolithography may include an exposing process and a developing process. The exposing process may include exposing a resist layer to a specific wavelength of light to induce the change of the chemical structure of the resist layer. The developing process may include the selective removing of the exposed part or the unexposed part of the resist layer by using a solubility difference between the exposed part and the unexposed part.

Recently, as semiconductor devices are highly integrated and downsized, the line width of patterns in semiconductor devices is miniaturized. In order to form minute patterns, various studies are conducted to improve the resolution and sensitivity of resist patterns formed by photolithography and to restrain the collapse of resist patterns.

SUMMARY

The task for solving of the present disclosure is to provide an underlayer compound, which may improve the resolution and sensitivity of a photoresist layer, restrain the collapse of a photoresist pattern, and have improved etching resistance, a multilayered structure formed using the same, and a method for manufacturing a semiconductor device using the same.

The task for solving of the present disclosure is not limited to the aforementioned tasks, and unreferred other tasks may be clearly understood by a person skilled in the art from the description below.

According to the inventive concept, an underlayer compound for photolithography includes an alternating copolymer including a repeating unit represented by Formula 1, or an alkylated tin oxide nanocluster having a counter anion.

[Formula 1]

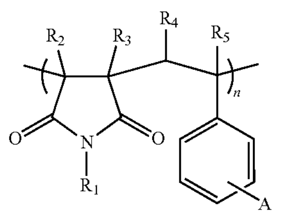

In Formula 1, $R_1$ is an alkyl group of 1 to 18 carbon atoms, $R_2$, $R_3$, $R_4$, and $R_5$ are each independently hydrogen, deuterium, or an alkyl group of 1 to 3 carbon atoms, A is iodine or tin having an alkyl group, and "n" is an integer of 2 to 10,000.

The alkylated tin oxide nanocluster includes a core structure including tin oxide, and an alkyl group of 1 to 18 carbon atoms, bonded to a tin atom of the core structure, and the counter anion is an alkylbenzene sulfonate anion.

According to the inventive concept, a multilayered structure includes a lower layer, an underlayer on the lower layer, and a photoresist layer on the underlayer. The underlayer includes an alternating copolymer including a repeating unit represented by Formula 1, or an alkylated tin oxide nanocluster having a counter anion.

According to the inventive concept, a method for manufacturing a semiconductor device includes forming an underlayer on a lower layer, and forming a photoresist layer on the underlayer. The forming of the underlayer includes applying an underlayer compound on the lower layer, the underlayer compound including an alternating copolymer including a repeating unit represented by Formula 1, or an alkylated tin oxide nanocluster having a counter anion.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
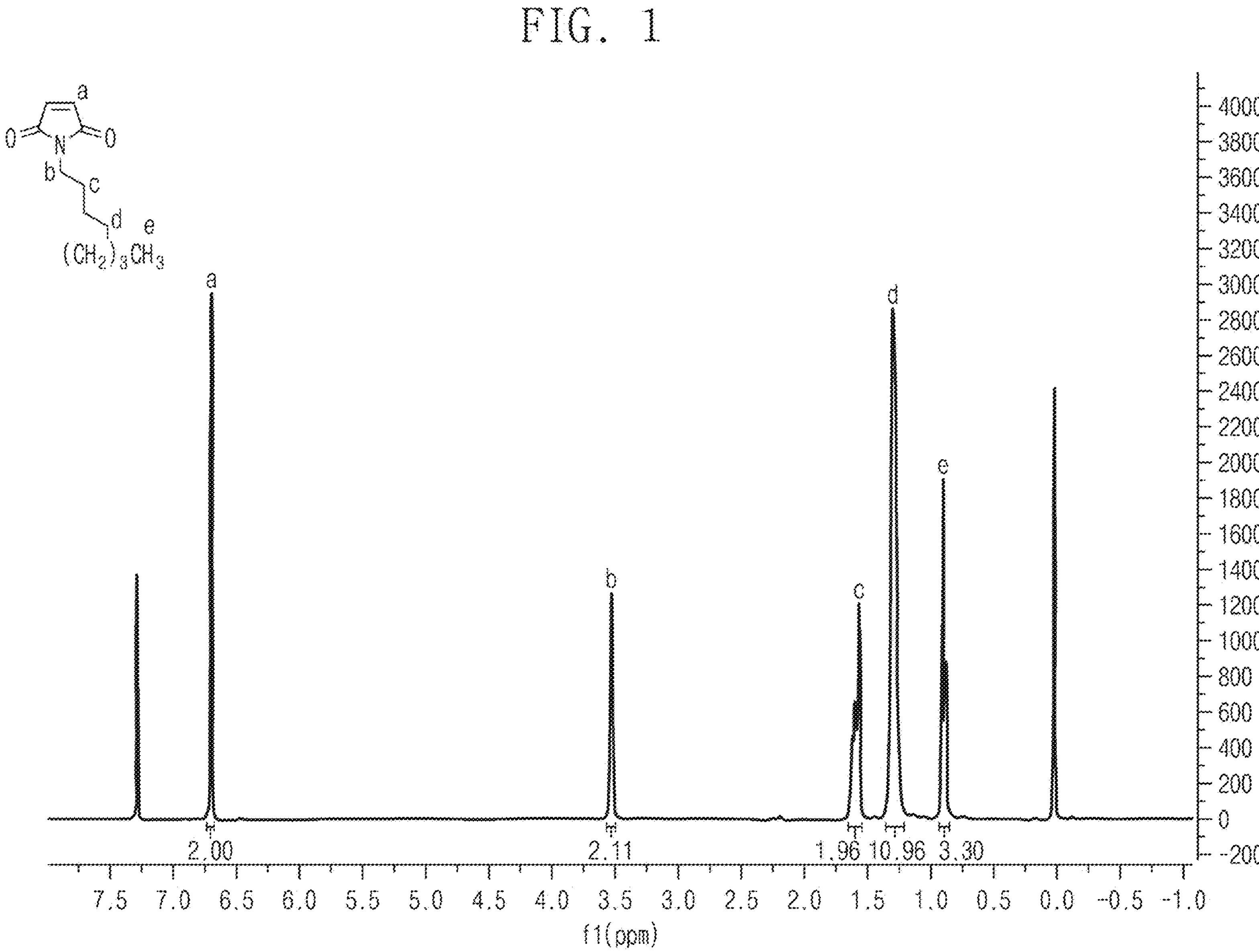
FIG. 1 is a graph showing the nuclear magnetic resonance spectrum results of alkyl chain-substituted maleimide ($R_H$MI8) produced according to Synthetic Example 1.

Preferred embodiments of the inventive concept will be explained with reference to the accompany drawings for sufficient understanding of the configurations and effects of the inventive concept. The inventive concept may, however, be embodied in various forms, have various modifications and should not be construed as limited to the embodiments set forth herein. The embodiments are provided to complete the disclosure of the inventive concept through the explanation of the embodiments and to completely inform a person having ordinary knowledge in this technical field to which the inventive concept belongs of the scope of the inventive concept.

The terminology used herein is for the purpose of describing example embodiments only and is not intended to be limiting of the inventive concept. In the disclosure, the singular forms are intended to include the plural forms as well, unless the context clearly indicates otherwise. It will be further understood that the terms "comprises" and/or "comprising," when used in this specification, specify the presence of stated elements, but do not preclude the presence or addition of one or more other elements.

In the present description, an alkyl group includes a linear, branched or cyclic monovalent saturated hydrocarbon group, unless otherwise indicated.

In the description, fluoroalkyl is an alkyl group in which at least one hydrogen is substituted with fluorine.

In the description, a case of not drawing a chemical bond at a position where a chemical bond is required, may mean that a hydrogen atom is bonded, unless otherwise defined.

Hereinafter, embodiments of the inventive concept will be explained in detail with reference to attached drawings. The same reference numerals are used for the same constituent elements on the drawings, and repeated explanation thereon will be omitted.

An underlayer compound according to embodiments of the inventive concept will be explained.

The underlayer compound according to embodiments of the inventive concept may be used for the manufacture of a semiconductor device and may be used in a photolithography process for the manufacture of a semiconductor device. The underlayer compound may be used, for example, in an extreme ultraviolet or electron beam lithography process. The extreme ultraviolet may mean ultraviolet having a wavelength of about 10 nm to about 124 nm, in detail, a wavelength of about 13.0 nm to about 13.9 nm, in more detail, a wavelength of about 13.4 nm to about 13.6 nm.

According to some embodiments, the underlayer compound may include an alternating copolymer including a repeating unit represented by Formula 1.

[Formula 1]

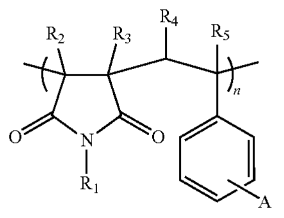

In Formula 1, $R_1$ is an alkyl group of 1 to 18 carbon atoms, $R_2$, $R_3$, $R_4$, and $R_5$ are each independently hydrogen, deuterium, or an alkyl group of 1 to 3 carbon atoms, A is hydrogen, iodine or tin having an alkyl group, and "n" is an integer of 2 to 10,000.

In Formula 1, A may be a functional group represented by Formula 2.

[Formula 2]

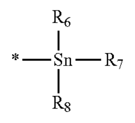

In Formula 2, $R_6$, $R_7$ and $R_8$ are each independently an alkyl group of 1 to 18 carbon atoms, and * is a part combined with carbon of Formula 1.

The underlayer compound may include an alternating copolymer including a repeating unit represented by Formula 3.

[Formula 3]

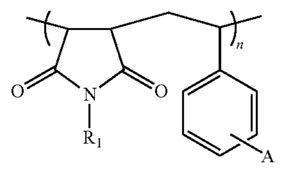

In Formula 3, $R_1$ is an alkyl group of 1 to 18 carbon atoms, A is hydrogen, iodine or tin having an alkyl group, and "n" is an integer of 2 to 10,000.

In Formula 3, A may be a functional group represented by Formula 2.

The underlayer compound may include, for example, an alternating copolymer including a repeating unit represented by Formula 3-1, Formula 3-2 or Formula 3-3.

[Formula 3-1]

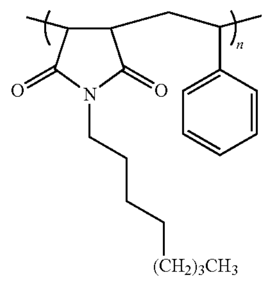

[Formula 3-2]

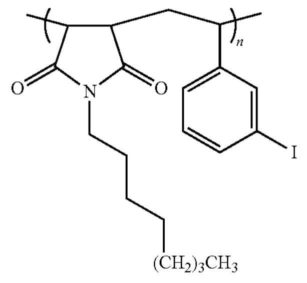

-continued

[Formula 3-3]

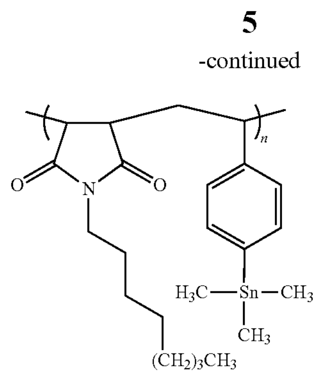

In Formula 3-1, Formula 3-2 and Formula 3-3, "n" is an integer of 2 to 10,000.

The underlayer compound may be synthesized by the radical polymerization reaction of an alkyl chain-substituted maleimide and a styrene derivative.

Synthetic Example 1

Synthesis of Alkyl Chain-Substituted Maleimide ($R_H$MI8) (Reaction 1)

To a round flask (250 $cm^3$), triphenylphosphine (2.65 g, 10.1 mmol) and tetrahydrofuran (THF, 70 $cm^3$) were injected and stirred to produce a solution, and the solution was cooled in a cooling bath to about −78° C. To the cooled solution, 1-octanol (1.45 g, 11.10 mmol) was injected to produce a reaction mixture, and the reaction mixture was stirred for about 1 hour. To the reaction mixture, diisopropyl azodicarboxylate (DIAD, 2.04 g, 10.1 mmol) was injected, and the reaction mixture was stirred for about 5 minutes. Neopentyl alcohol (0.489 g, 5.55 mmol) and maleimide (1.00 g, 10.1 mmol) were added to the reaction mixture to produce a reaction product, and the reaction product was stirred at about −78° C. for about 10 minutes in a cooling bath. The cooling bath was removed, and the reaction product was stirred at room temperature for about 12 hours. After finishing the reaction, the reaction product was concentrated under a reduced pressure to obtain a product. The product was purified through column chromatography (using silica gel and dichloromethane). After that, the product was recrystallized (using isopropanol:hexane=1:2 as solvents) to finally synthesize 1-octyl-1H-pyrrole-2,5-dione ($R_H$MI8) (1.6 g, yield 38%) as a white solid. 1H NMR (400 MHz, $CDCl_3$): δ=6.7 (s, 2H), 3.53 (t, J=8 Hz, 2H), 1.65-1.58 (m, 2H), 1.37-1.19 (m, 10H), 0.94-0.83 (m, 3H).

[Reaction 1]

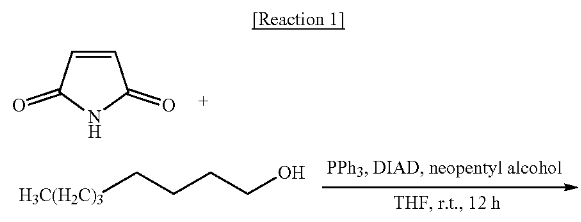

-continued

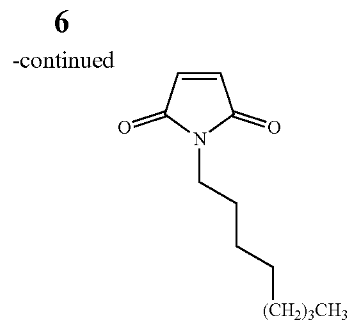

FIG. 1 is a graph showing the nuclear magnetic resonance spectrum results of alkyl chain-substituted maleimide ($R_H$MI8) produced according to Synthetic Example 1. Referring to FIG. 1, the production of 1-octyl-1H-pyrrole-2,5-dione ($R_H$MI8) according to Synthetic Example 1 may be confirmed.

Synthetic Example 2-1

Synthesis of Iodine-Introduced Styrene (ISO (Reaction 2-1)

To a round flask (250 $cm^3$), 3-iodobenzaldehyde (3 g, 12.93 mmol), methyltriphenylphosphonium bromide (6.93 g, 19.39 mmol) and THF (75 $cm^3$) were injected to produce a reaction product, and the reaction product was stirred at a temperature of about 0° C. in a cooling bath. After that, a solution of potassium tert-butoxide (2.18 g, 19.39 mmol) dissolved in THF (20 $cm^3$) was added dropwisely to the reaction product and stirred. The cooling bath was removed, and the reaction product was stirred at room temperature for about 1 hour. After finishing the reaction, hexane (100 $cm^3$) was injected to the reaction product to produce a solid product, and the solid product was filtered through celite to obtain an organic solvent layer. Then, the filtered organic solvent layer was concentrated under reduced pressure conditions to obtain a product. The product was purified through column chromatography (using silica gel and hexane) to finally recover 3-iodostyrene (ISt) (1.7 g, yield 57%) as a pale yellow viscous liquid. $^1$H NMR (400 MHz, $CDCl_3$): δ=7.79 (s, 1H), 7.61 (d, J=7.8 Hz, 1H), 7.38 (d, J=7.7 Hz, 1H), 7.08 (t, J=7.8 Hz, 1H), 6.64 (dd, J=6.4, 28.4 Hz, 1H), 5.76 (d, J=17.6 Hz, 1H), 5.31 (d, J=10.9 Hz, 1H).

[Reaction 2-1]

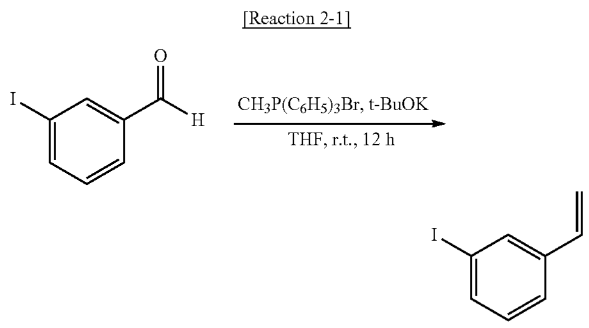

Figure 2A:
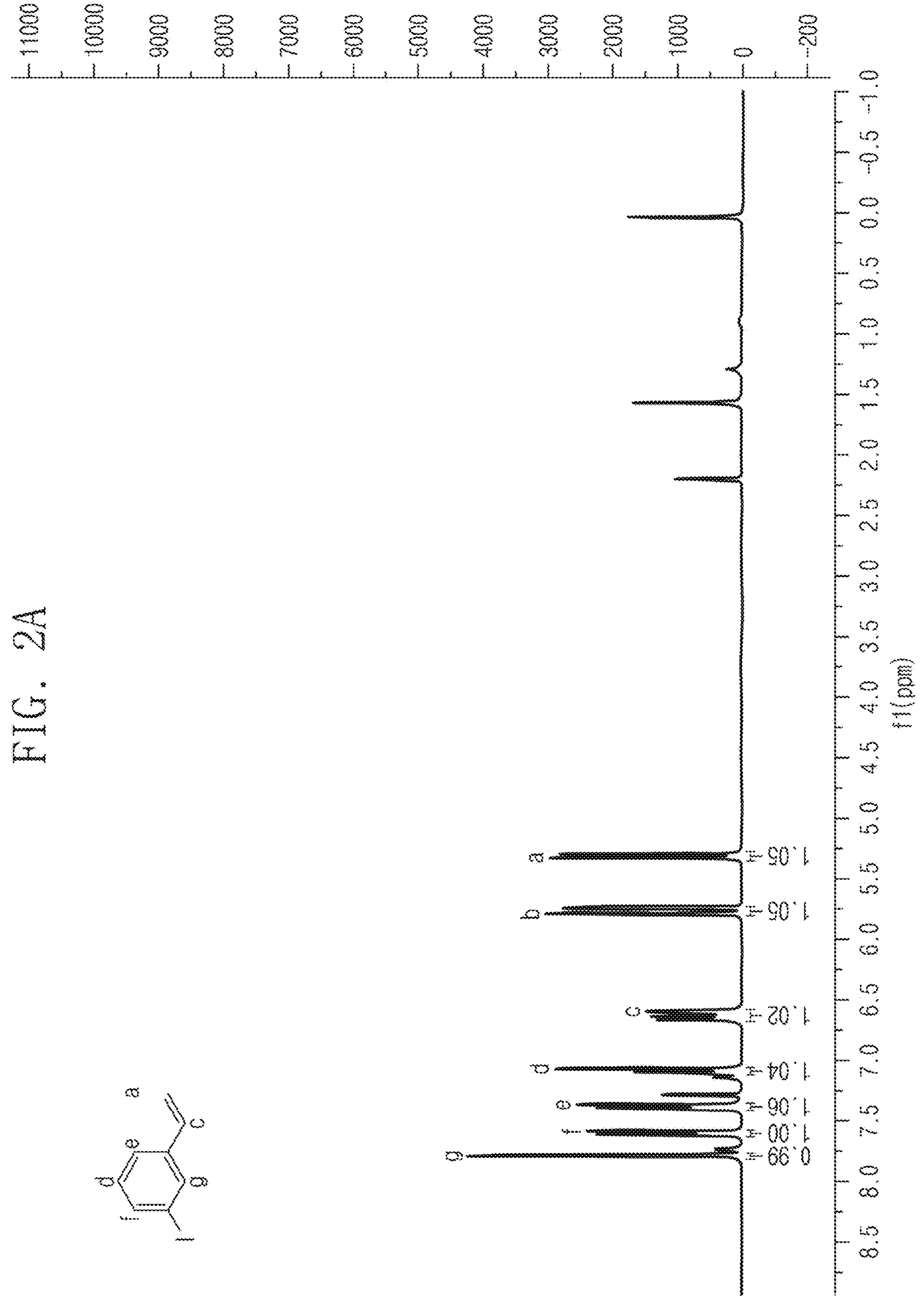
FIG. 2A is a graph showing the nuclear magnetic resonance spectrum results of iodine-introduced styrene (ISO produced according to Synthetic Example 2-1.

FIG. 2A is a graph showing the nuclear magnetic resonance spectrum results of iodine-introduced styrene (ISt) produced according to Synthetic Example 2-1. Referring to FIG. 2A, the production of 3-iodostyrene (ISO according to Synthetic Example 2-1 may be confirmed.

Synthetic Example 2-2

Synthesis of Tin-Introduced Styrene (SnSt) (Reaction 2-2)

To a round flask (100 $cm^3$), magnesium turning (1.2 g, 49.2 mmol) and THF (7 $cm^3$) were added to produce a solution. A freeze-pump-thaw process was performed three times to remove oxygen in the solution. Then, the solution was stirred at about 60° C. for about 1 hour, and 4-bromostyrene (5.0 g, 27.3 mmol) and THF (30 $cm^3$) were added dropwisely to the solution to produce a reaction mixture. The reaction mixture was stirred at room temperature for about 2 hours. After finishing the reaction, water (20 $cm^3$) and hexane (100 $cm^3$) were added to the reaction mixture, an insoluble component was removed by filtering using alumina. The filtrate was washed with water and a saturated aqueous sodium chloride solution, and anhydrous $MgSO_4$ was added to the filtrate, followed by stirring to remove remaining moisture in the filtrate. The filtrate was concentrated to obtain a product, and the product was purified through column chromatography (using silica gel and hexane) to synthesize 4-trimethylstannyl styrene (SnSt) (3.5 g, 48%) as a colorless liquid. $^1H$ NMR (400 MHz, Acetone-d6): δ=7.45 (dd, J=26, 7 Hz 4H), 6.73 (dd, J=18, 11 Hz, 1H), 5.81 (d, J=18 Hz 1H), 5.22 (d, J=11 Hz 1H) 0.36-0.20 (m, 9H).

[Reaction 2-2]

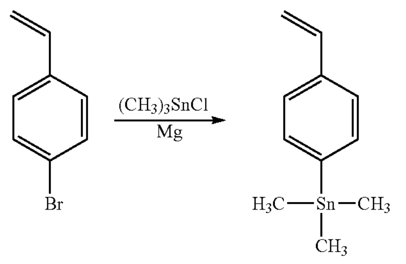

Figure 2B:
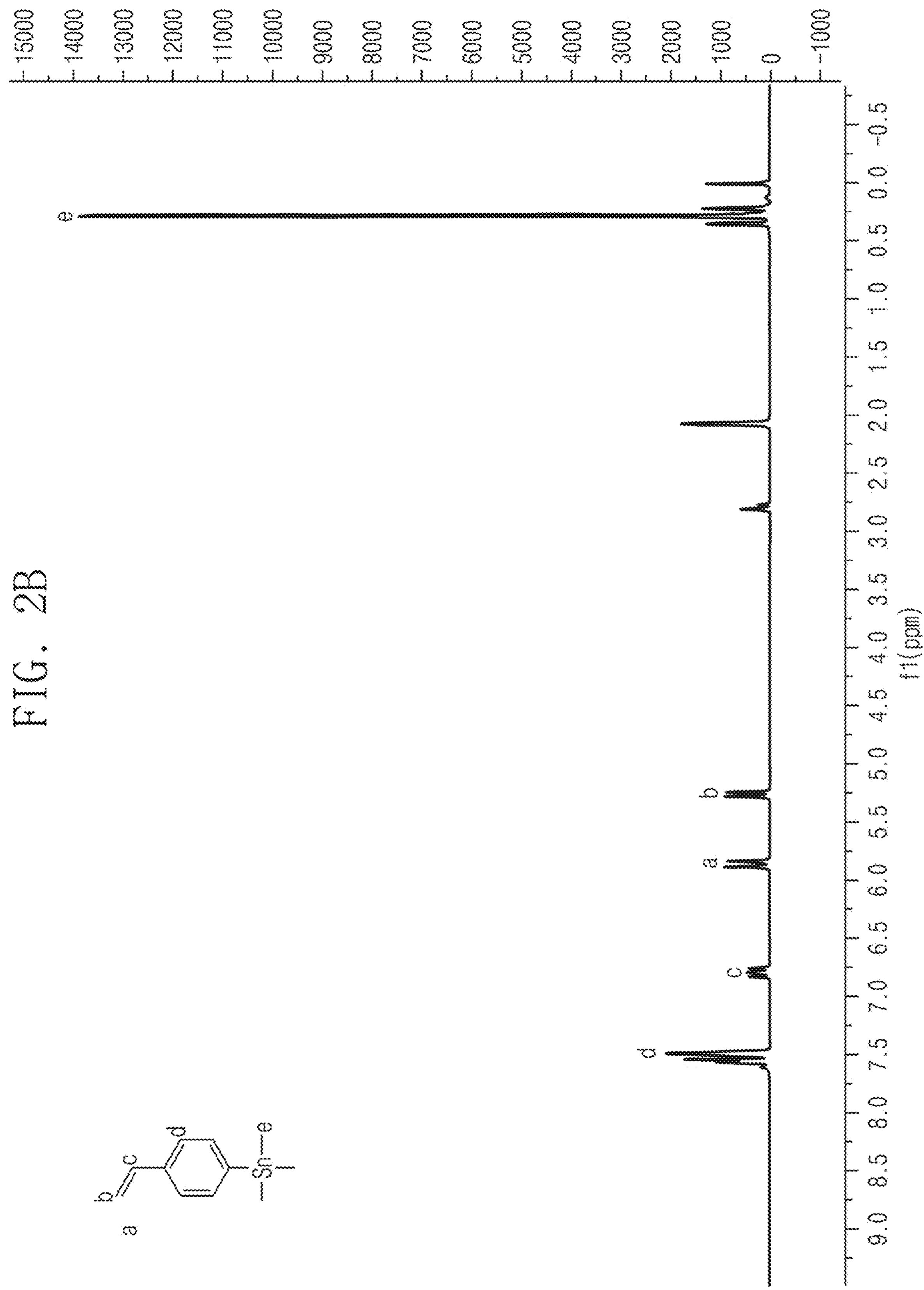
FIG. 2B is a graph showing the nuclear magnetic resonance spectrum results of tin-introduced styrene (SnSt) produced according to Synthetic Example 2-2.

FIG. 2B is a graph showing the nuclear magnetic resonance spectrum results of tin-introduced styrene (SnSt) produced according to Synthetic Example 2-2. Referring to FIG. 2B, the production of 4-trimethylstannyl styrene (SnSt) according to Synthetic Example 2-2 may be confirmed.

Synthetic Example 3-1

Synthesis of Underlayer Compound (P($R_H$MI8-St)) of Formula 3-1 (Reaction 3-1)

To a Schlenk tube (50 $cm^3$), $R_H$MI8 (1.0 g, 4.78 mmol), styrene (purchased from TCI Co.) (0.5 g, 4.78 mmol), and 2,2'-azobis(2-methylpropionitrile) (AIBN, 0.01 g, 0.06 mmol) were injected, and nitrogen purging was performed. THF (20 $cm^3$) undergone bubbling with a nitrogen gas in advance was injected into the tube under nitrogen conditions to produce a solution, and a freeze-pump-thaw process was performed three times to remove oxygen in the solution. Then, the solution was stirred at a temperature of about 60° C. for about 12 hours. After that, the solution in the tube was added dropwisely to hexane (300 $cm^3$) to produce a precipitate, and the precipitate was filtered to recover. After drying the precipitate, from GPC analysis results, 0.64 g of a polymer (P($R_H$MI8-St)) having a number average molecular weight ($M_n$) of 15,605 and a polydispersity index (PDI) of 1.63 was obtained.

[Reaction 3-1]

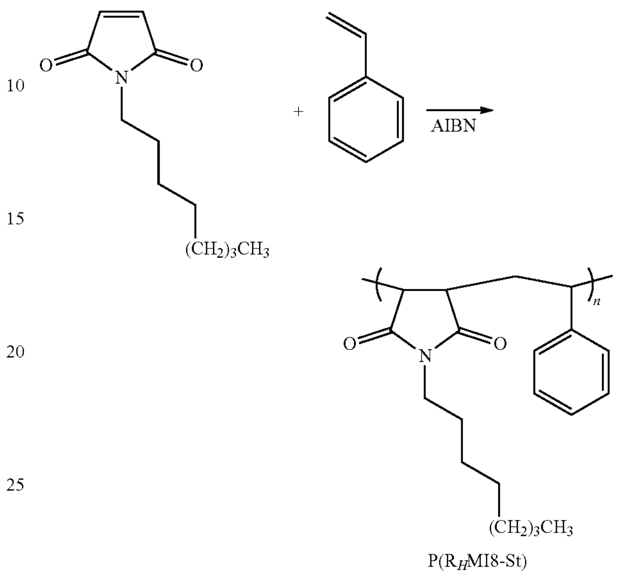

Synthetic Example 3-2

Synthesis of Underlayer Compound (P($R_H$MI8-ISt)) of Formula 3-2 (Reaction 3-2)

To a Schlenk tube (25 $cm^3$), $R_H$MI8 (0.5 g, 2.39 mmol), 3-iodostyrene ISt (0.55 g, 2.39 mmol), and AIBN (0.005 g, 0.03 mmol) were injected, and nitrogen purging was performed. THF (6 $cm^3$) undergone bubbling with a nitrogen gas in advance was injected into the tube under nitrogen conditions to produce a solution, and a freeze-pump-thaw process was performed three times to remove oxygen in the solution. Then, the solution was stirred at a temperature of about 60° C. for about 12 hours. After that, the solution in the tube was added dropwisely to hexane (250 $cm^3$) to produce a precipitate, and the precipitate was filtered to recover. After drying the precipitate, from GPC analysis results, 0.68 g of a polymer (P($R_H$MI8-ISt)) having a number average molecular weight ($M_n$) of 12,543 and a polydispersity index (PDI) of 2.10 was obtained.

[Reaction 3-2]

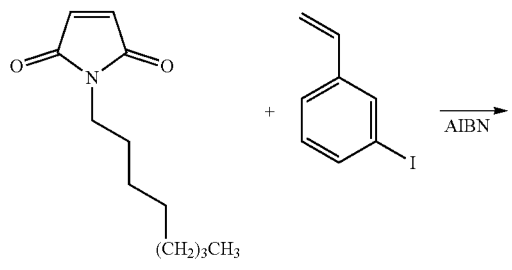

-continued

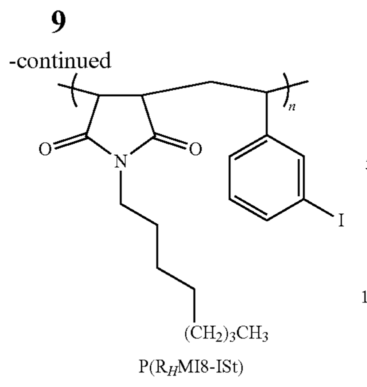

P($R_H$MI8-ISt)

Synthetic Example 3-3

Synthesis of Underlayer Compound (P($R_H$MI8-SnSt)) of Formula 3-3 (Reaction 3-3)

To a Schlenk tube (25 $cm^3$), $R_H$MI8 (0.5 g, 2.39 mmol), 4-trimethylstannylstyrene (SnSt, 0.64 g, 2.39 mmol), and AIBN (0.005 g, 0.030 mmol) were injected, and nitrogen purging was performed. THF (10 $cm^3$) undergone bubbling with a nitrogen gas in advance was injected into the tube under nitrogen conditions to produce a solution, and a freeze-pump-thaw process was performed three times to remove oxygen in the solution. Then, the solution was stirred at a temperature of about 60° C. for about 12 hours. After that, the solution in the tube was added dropwisely to methanol (250 $cm^3$) to produce a precipitate, and the precipitate was filtered to recover. After drying the precipitate, from GPC analysis results, 0.68 g of a polymer (P($R_H$MI8-SnSt)) having a number average molecular weight ($M_n$) of 15,551 and a polydispersity index (PDI) of 2.12 was obtained.

[Reaction 3-3]

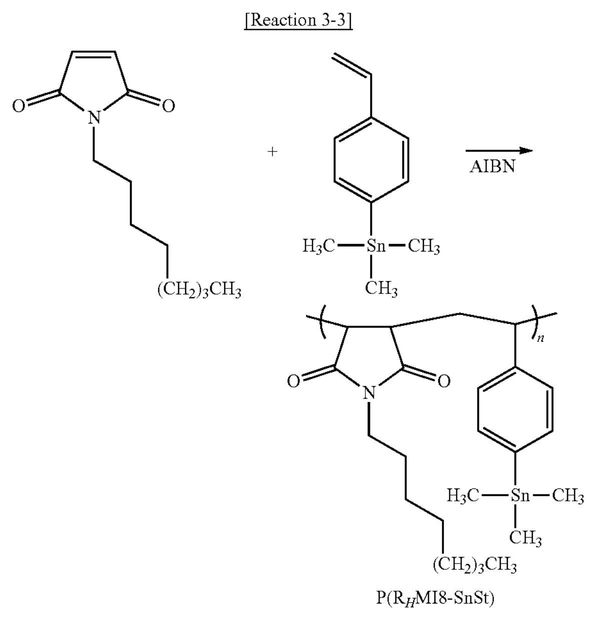

P($R_H$MI8-SnSt)

Table 1 represents the molecular weights of the underlayer compounds synthesized according to Synthetic Example 3-1 to Synthetic Example 3-3.

TABLE 1

| Underlayer compound | Number average molecular weight ($M_n$) | Weight average molecular weight ($M_w$) | Polydispersity index (PDI) |
|---|---|---|---|
| P($R_H$MI8-St) | 15605 | 25362 | 1.63 |
| P($R_H$MI8-ISt) | 12543 | 26337 | 2.10 |
| P($R_H$MI8-SnSt) | 15551 | 32905 | 2.12 |

Experimental Example 1-1

Evaluation of Solubility of Resist Thin Film Formed on a Substrate Coated with Underlayer Compound (P($R_H$MI8-St)) of Formula 3-1

A solution (1.0 wt/vol %) of P($R_H$MI8-St) dissolved in propylene glycol monomethyl ether acetate (PGMEA) was applied on a silicon substrate by spin coating at about 1,500 rpm for about 60 seconds and heated at about 110° C. for about 1 minute to form an underlayer (thickness of about 23 nm). On the silicon substrate coated with P($R_H$MI8-St) as an underlayer, a P($R_F$MI6-St) solution (1.2 wt/vol %, Korean Patent Application No. 10-2017-0085451/ Registration No. 10-1901522) dissolved in PF-7600 (3M Co.) was applied by spin coating at about 1,500 rpm for about 60 seconds and heated at about 110° C. for about 1 minute to form a resist thin film (thickness of about 25 nm, total thickness of stacked thin films of about 48 nm). Then, extreme ultraviolet was irradiated with a dosage in a range of about 3 mJ/$cm^2$ to about 60 mJ/$cm^2$, and a developing process was performed using PF-7600 for about 30 seconds to form a resist pattern (circular). The thickness of the resist pattern remained on the silicon substrate was measured according to the dosage, and the solubility property change of the resist thin film was evaluated.

Experimental Example 1-2

Evaluation of Solubility of Resist Thin Film Formed on a Substrate Coated with Underlayer Compound (P($R_H$MI8-ISt)) of Formula 3-2

A solution (1.0 wt/vol %) of P($R_H$MI8-ISt) dissolved in propylene glycol monomethyl ether acetate (PGMEA) was applied on a silicon substrate by spin coating at about 1,500 rpm for about 60 seconds and heated at about 110° C. for about 1 minute to form an underlayer (thickness of about 23 nm). On the silicon substrate coated with P($R_H$MI8-ISt) as an underlayer, a P($R_F$MI6-St) solution (1.2 wt/vol %, Korean Patent Application No. 10-2017-0085451/ Registration No. 10-1901522) dissolved in PF-7600 (3M Co.) was applied by spin coating at about 1,500 rpm for about 60 seconds and heated at about 110° C. for about 1 minute to form a resist thin film (thickness of about 25 nm, total thickness of stacked thin films of about 48 nm). Then, extreme ultraviolet was irradiated with a dosage in a range of about 3 mJ/$cm^2$ to about 60 mJ/$cm^2$, and a developing process was performed using PF-7600 for about 30 seconds to form a resist pattern (circular). The thickness of the resist pattern remained on the silicon substrate was measured according to the dosage, and the solubility property change of the resist thin film was evaluated.

Experimental Example 1-3

Evaluation of Solubility of Resist Thin Film Formed on a Substrate Coated with Underlayer Compound (P($R_H$MI8-SnSt)) of Formula 3-3

A solution (1.0 wt/vol %) of P($R_H$MI8-SnSt) dissolved in propylene glycol monomethyl ether acetate (PGMEA) was applied on a silicon substrate by spin coating at about 1,500 rpm for about 60 seconds and heated at about 110° C. for about 1 minute to form an underlayer (thickness of about 21 nm). On the silicon substrate coated with P($R_H$MI8-SnSt) as an underlayer, a P($R_F$MI6-St) solution (1.2 wt/vol %, Korean Patent Application No. 10-2017-0085451/ Registration No. 10-1901522) dissolved in PF-7600 (3M Co.) was applied by spin coating at about 1,500 rpm for about 60 seconds and heated at about 110° C. for about 1 minute to form a resist thin film (thickness of about 25 nm, total thickness of stacked thin films of about 46 nm). Then, extreme ultraviolet was irradiated with a dosage in a range of about 3 mJ/$cm^2$ to about 60 mJ/$cm^2$, and a developing process was performed using PF-7600 for about 30 seconds to form a resist pattern (circular). The thickness of the resist pattern remained on the silicon substrate was measured according to the dosage, and the solubility property change of the resist thin film was evaluated.

In Experimental Example 1-1, Experimental Example 1-2 and Experimental Example 1-3, P($R_F$MI6-St) used for the formation of the resist thin films may include an alternating copolymer including a repeating unit represented by Formula 4.

[Formula 4]

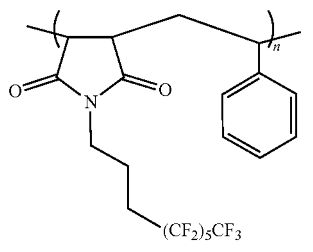

Figure 3:
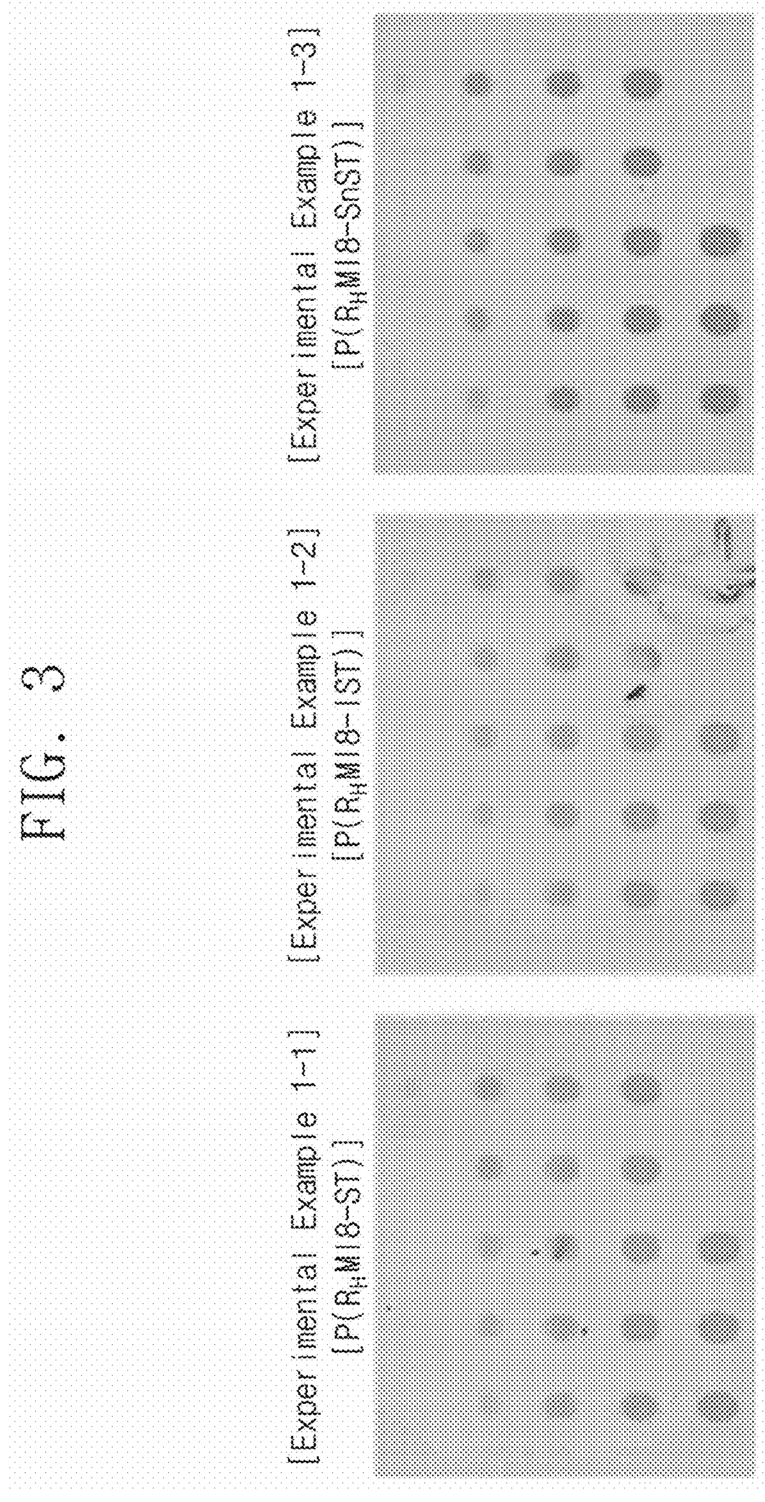
FIG. 3 shows images of negative tone resist patterns formed by an extreme ultraviolet lithography process according to Experimental Example 1-1, Experimental Example 1-2, and Experimental Example 1-3.

FIG. 3 shows images of negative tone resist patterns formed by an extreme ultraviolet lithography process according to Experimental Example 1-1, Experimental Example 1-2, and Experimental Example 1-3.

Referring to FIG. 3, according to Experimental Example 1-1, it may be confirmed that the negative tone resist pattern (circular) is formed by forming the resist thin film on the underlayer formed by applying the underlayer compound of Formula 3-1 (P($R_H$MI8-St)) on the silicon substrate, and performing an extreme ultraviolet lithography process on the resist thin film. In addition, according to Experimental Example 1-2, it may be confirmed that the negative tone resist pattern (circular) is formed by forming the resist thin film on the underlayer formed by applying the underlayer compound of Formula 3-2 (P($R_H$MI8-ISt)) on the silicon substrate, and performing an extreme ultraviolet lithography process on the resist thin film. Further, according to Experimental Example 1-3, it may be confirmed that the negative tone resist pattern (circular) is formed by forming the resist thin film on the underlayer formed by applying the underlayer compound of Formula 3-3 (P($R_H$MI8-SnSt)) on the silicon substrate, and performing an extreme ultraviolet lithography process on the resist thin film.

Figure 4:
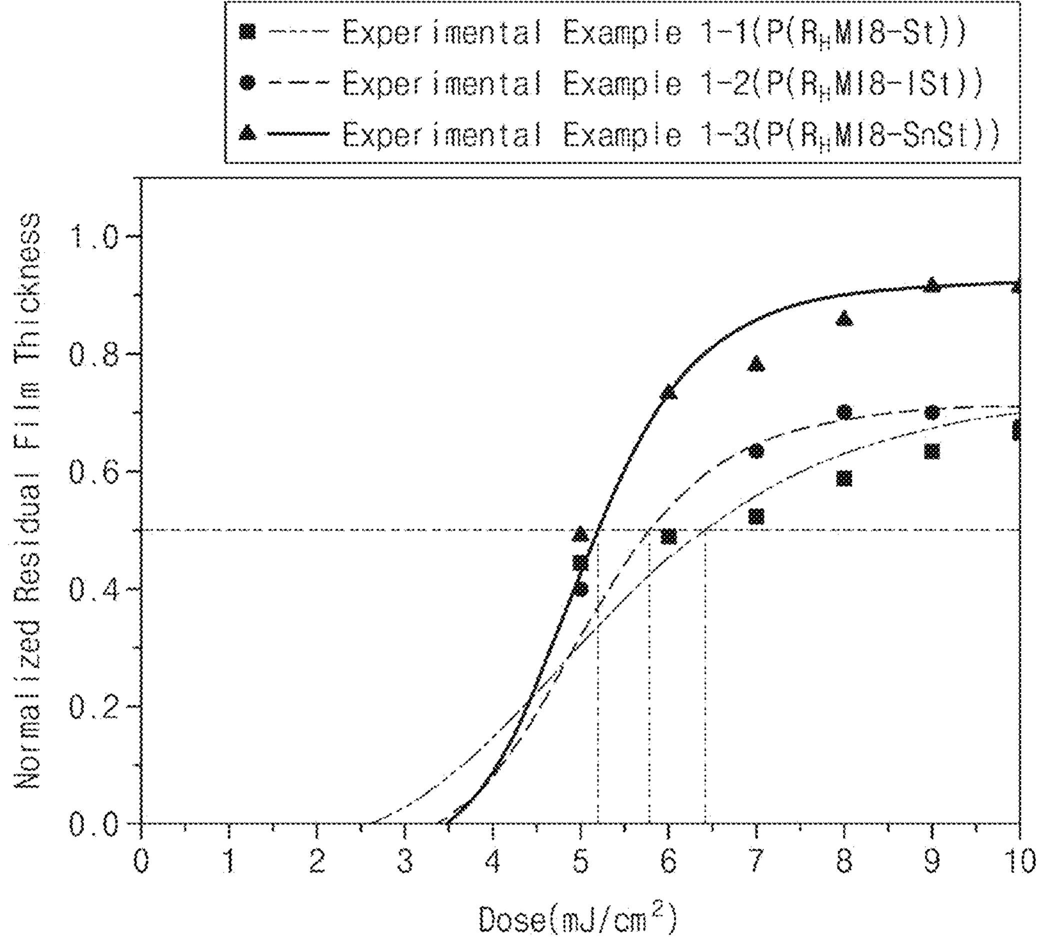
FIG. 4 shows a graph illustrating evaluation results of the solubility of resist thin films according to Experimental Example 1-1, Experimental Example 1-2, and Experimental Example 1-3.

FIG. 4 shows a graph illustrating evaluation results of the solubility of resist thin films according to Experimental Example 1-1, Experimental Example 1-2, and Experimental Example 1-3.

Referring to FIG. 4, in the case of a substrate on which the underlayer compound of Formula 3-1 (P($R_H$MI8-St)) is coated, when extreme ultraviolet of about 6.4 mJ/$cm^2$ is irradiated on the resist thin film, the thickness of the resist pattern may be maintained to about 50% of the thickness of the resist thin film. In the case of a substrate on which the underlayer compound of Formula 3-2 (P($R_H$MI8-ISt)) is coated, when extreme ultraviolet of about 5.8 mJ/$cm^2$ is irradiated on the resist thin film, the thickness of the resist pattern may be maintained to about 50% of the thickness of the resist thin film. In the case of a substrate on which the underlayer compound of Formula 3-3 (P($R_H$MI8-SnSt)) is coated, when extreme ultraviolet of about 5.2 mJ/$cm^2$ is irradiated on the resist thin film, the thickness of the resist pattern may be maintained to about 50% of the thickness of the resist thin film.

According to some embodiments, the underlayer compound may include an alkylated tin oxide nanocluster having a counter anion. The alkylated tin oxide nanocluster may include a core structure including tin oxide, and an alkyl group of 1 to 18 carbon atoms, bonded to the tin element of the core structure. The core structure may include a cation, and may make an ionic bond with the counter anion. The counter anion may be an alkylbenzene sulfonate anion.

The underlayer compound may include a structure of Formula 5.

[Formula 5]

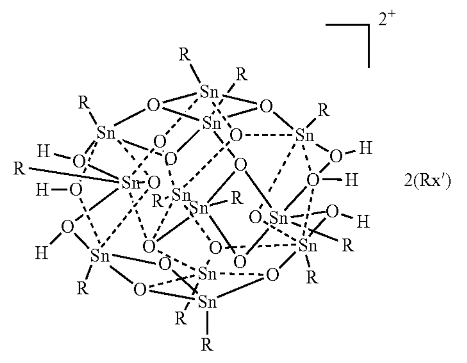

In Formula 5, R may be an alkyl group of 1 to 18, $Rx^-$ may be a counter anion and may be a alkylbenzene sulfonate anion. For example, R may be a butyl group.

The $Rx^-$ may have a structure of Formula 6.

[Formula 6]

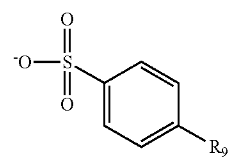

In Formula 6, $R_9$ is an alkyl group of 1 to 18 carbon atoms. For example, $R_9$ may have a structure of $-CH_2(CH_2)_{10}CH_3$.

Synthetic Example 4

Synthesis of Underlayer Compound of Formula 5 (DS-BTOC) (Reaction 4)

In a 100 $cm^3$ vial, tetramethylammonium hydroxide pentahydrate (5.78 g, 31.9 mmol) was dissolved in deionized water (DI water, 64 $cm^3$), and butyltin trichloride (3.0 g, 10.6 mmol) was quickly injected into the vial to produce a first reaction solution. The first reaction solution was vigorously stirred at room temperature for about 1 hour to obtain a product, and the product was washed with DI water several times and filtered. The product was dried in vacuum to obtain an alkylated tin oxide nanocluster (BTOC, 1.8 g) as a white solid phase. Then, BTOC (1.0 g, 0.4 mmol) was dissolved in THF (7 $cm^3$) to produce a solution, and a dodecylbenzenesulfonic acid solution dissolved in THF (3 $cm^3$) in advance was injected thereto to produce a second reaction solution. The second reaction solution was stirred at about 50° C. for about 10 minutes and concentrated. The concentrated material was injected into heptane (100 $cm^3$) to form a precipitate, and the precipitate was filtered to recover. The precipitate was dried in vacuum to obtain DS-BTOC (0.5 g) as a yellow solid phase.

Experimental Example 2

Evaluation of Solubility of Resist Thin Film Formed on a Substrate Coated with Underlayer Compound (DS-BTOC) of Formula 5

1) Comparative Example 1

Substrate Coated with Monomolecular Underlayer (VTMS, Vinyltrimethoxysilane)

A solution (20 wt %) of VTMS dissolved in PGMEA was applied on a silicon substrate by spin coating at about 3,000 rpm for about 30 seconds and heated at about 110° C. for about 1 minute to form a first underlayer. Then, on the silicon substrate coated with the first underlayer, a N-TOC6 solution (1.2 wt/vol %, Korean Patent Application No. 10-2022-0072386) dissolved in HFE-7500 (3M Co.) was applied by spin coating at about 1,500 rpm for about 60 seconds and heated at about 80° C. for about 1 minute to form a resist thin film (thickness of about 34 nm). Then, an exposing process was performed using extreme ultraviolet with a dosage in a range of about 2 mJ/$cm^2$ to about 50 mJ/$cm^2$, and a developing process was performed using

[Reaction 4]

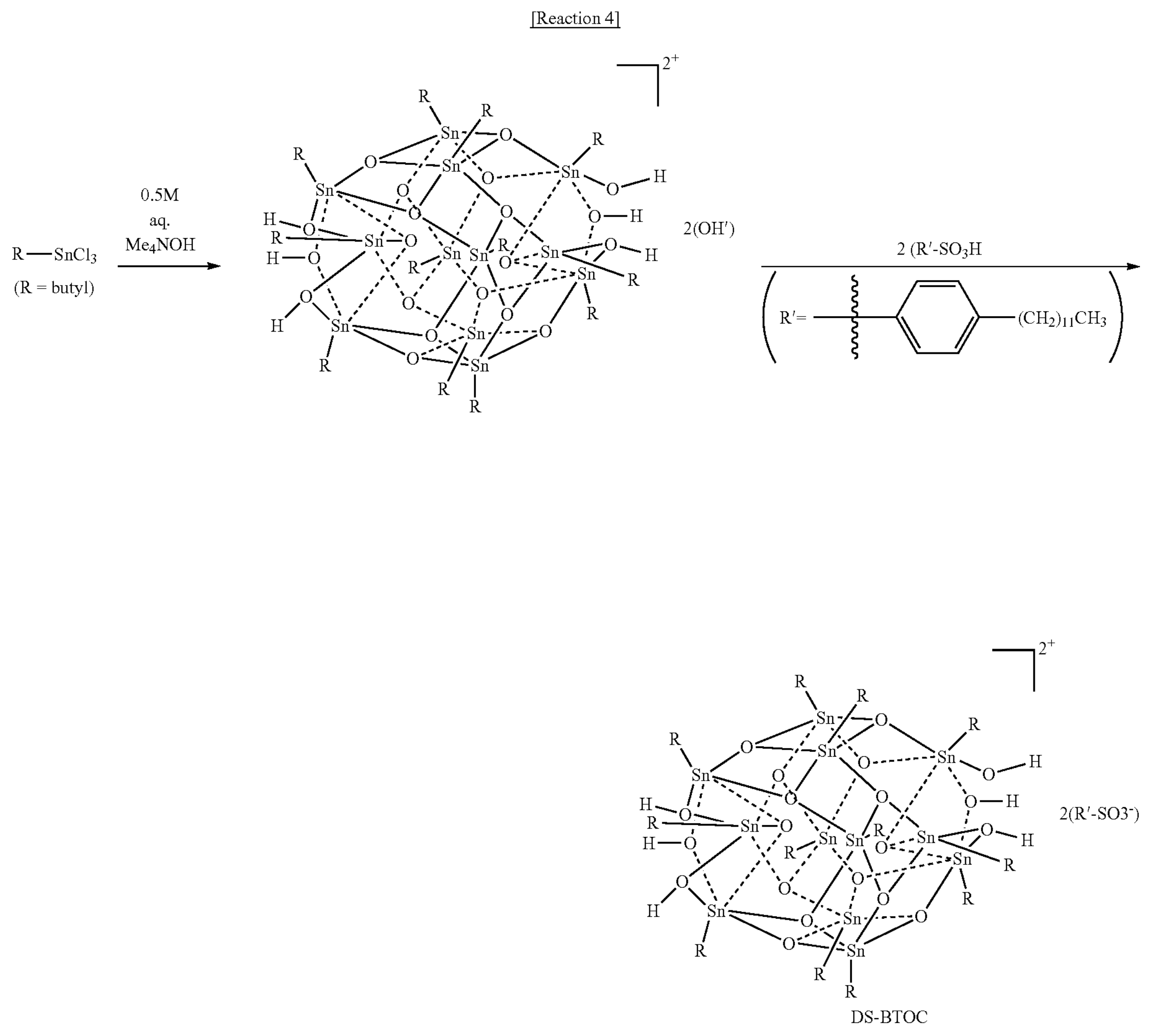

DS-BTOC

HFE-7500 for about 40 seconds to form a resist pattern (circular). The thickness of the resist pattern remained on the silicon substrate was measured according to the dosage, and the solubility property change of the resist thin film was evaluated. Further, a dosage required for the resist pattern (circular) having a longitudinal diameter of about 180 μm was measured, and the size change of the resist pattern according to the dosage was evaluated.

2) Comparative Example 2

Substrate Coated with a Polymer Underlayer (Korean Patent Application No. 10-2022-0087787)

A solution (0.8 wt/vol %) of a polymer compound dissolved in PGMEA was applied on a silicon substrate by spin coating at about 2,500 rpm for about 60 seconds and heated at about 110° C. for about 1 minute to form a second underlayer (thickness of about 15 nm). Then, on the silicon substrate coated with the second underlayer, a N-TOC6 solution (1.2 wt/vol %, Korean Patent Application No. 10-2022-0072386) dissolved in HFE-7500 (3M Co.) was applied by spin coating at about 1,500 rpm for about 60 seconds and heated at about 80° C. for about 1 minute to form a resist thin film (thickness of about 34 nm, total thickness of stacked thin films of about 49 nm). Then, an extreme ultraviolet exposing process was performed with a dosage in a range of about 2 $mJ/cm^2$ to about 50 $mJ/cm^2$, and a developing process was performed using HFE-7500 for about 40 seconds to form a resist pattern (circular). The thickness of the resist pattern remained on the silicon substrate was measured according to the dosage, and the solubility property change of the resist thin film was evaluated. Further, a dosage required for the resist pattern (circular) having a longitudinal diameter of about 180 μm was measured, and the size change of the resist pattern according to the dosage was evaluated.

3) Experimental Example

Substrate Coated with Underlayer Compound (DS-BTOC) of Formula 5

A DS-BTOC solution (1.2 wt/vol %) dissolved in a mixture solvent of n-butyl acetate (nBA) and methyl isobutyl ketone (MIBK) (1:1 by volume), was applied on a silicon substrate by spin coating at about 2,000 rpm for about 60 seconds and heated at about 80° C. for about 1 minute to form a third underlayer (thickness of about 25 nm). Then, on the silicon substrate coated with the third underlayer, a N-TOC6 solution (1.2 wt/vol %, Korean Patent Application No. 10-2022-0072386) dissolved in HFE-7500 (3M Co.) was applied by spin coating at about 1,500 rpm for about 60 seconds and heated at about 80° C. for about 1 minute to form a resist thin film (thickness of about 34 nm, total thickness of stacked thin films of about 59 nm). Then, an extreme ultraviolet exposing process was performed with a dosage in a range of about 2 $mJ/cm^2$ to about 50 $mJ/cm^2$, and a developing process was performed using HFE-7500 for about 40 seconds to form a resist pattern (circular). The thickness of the resist pattern remained on the silicon substrate was measured according to the dosage, and the solubility property change of the resist thin film was evaluated. Further, a dosage required for the resist pattern (circular) having a longitudinal diameter of about 180 μm was measured, and the size change of the resist pattern according to the dosage was evaluated.

In Experimental Example 2, the polymer compound used for forming the second underlayer (Korean Patent Application No. 10-2022-0087787) may include a copolymer including a repeating unit represented by Formula 7, and the N-TOC6 used for forming the resist thin film (Korean Patent Application No. 10-2022-0072386) may include a material represented by Formula 8.

[Formula 7]

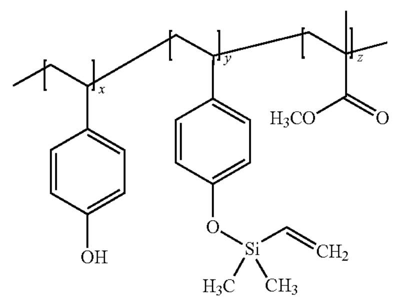

In Formula 7, a ratio of (x+y) to z is within a range of about 40:60 to about 60:40, and a ratio of x to y is within a range of about 90:10 to about 30:70.

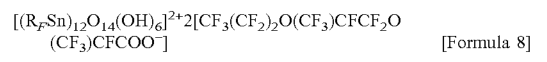

$[(R_FSn)_{12}O_{14}(OH)_6]^{2+}2[CF_3(CF_2)_2O(CF_3)CFCF_2O(CF_3)CFCOO^-]$ [Formula 8]

In Formula 8, $R_F$ is a fluoroalkyl group of 1 to 18 carbon atoms. For example, $R_F$ may have a structure of $-(CH_2)_2(CF_2)_5CF_3$.

Figure 5:
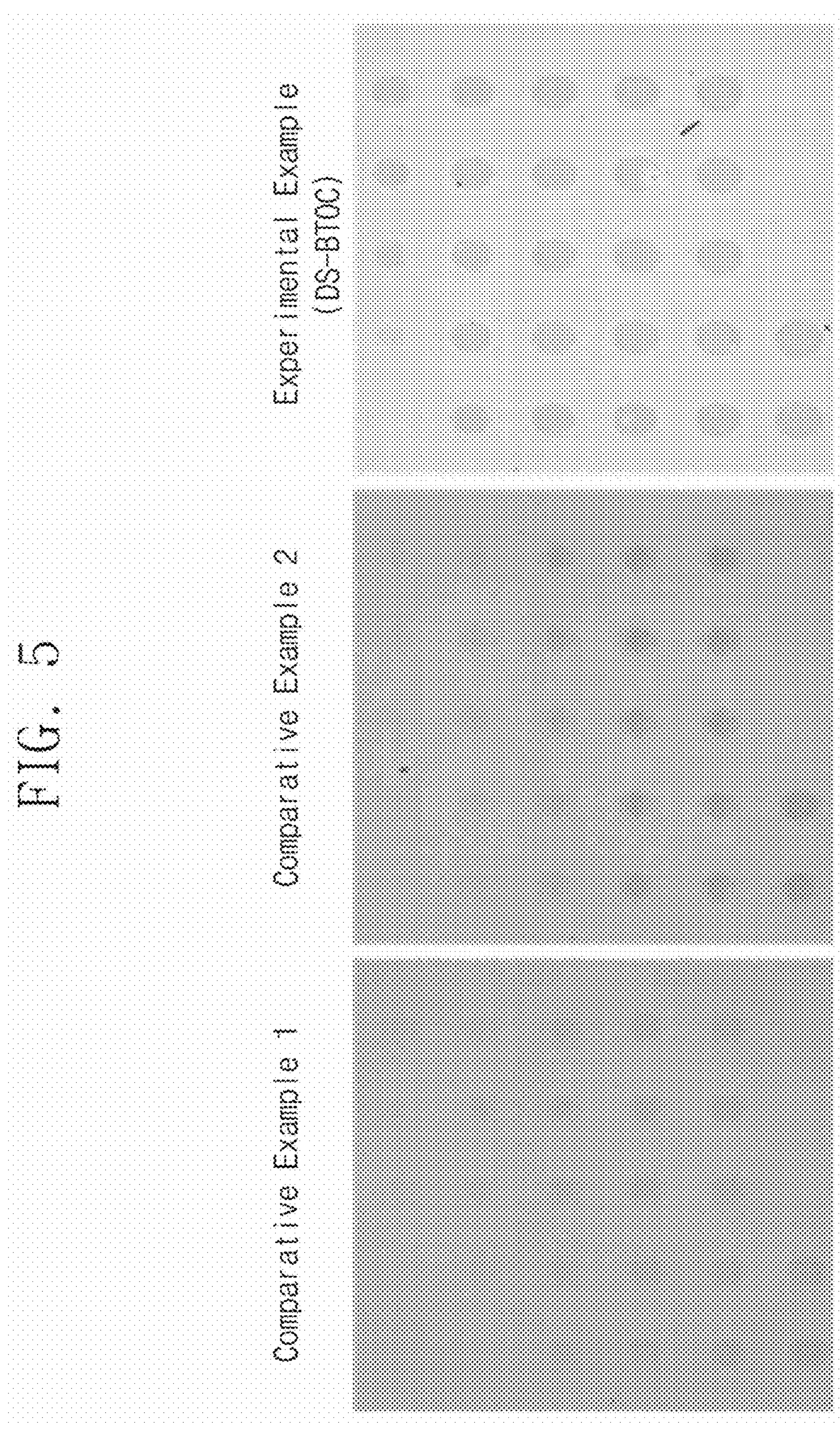
FIG. 5 shows images of negative tone resist patterns formed by an extreme ultraviolet lithography process according to Experimental Example 2.

FIG. 5 shows images of negative tone resist patterns formed by an extreme ultraviolet lithography process according to Experimental Example 2.

Referring to FIG. 5, according to Comparative Example 1, it may be confirmed that a resist thin film is formed on the substrate on which the first underlayer (VTMS) is coated, and an extreme ultraviolet lithography process is performed on the resist thin film to form a negative tone resist pattern having a circular shape. In addition, according to Comparative Example 2, it may be confirmed that a resist thin film is formed on the substrate on which the second underlayer (polymer compound) is coated, and an extreme ultraviolet lithography process is performed on the resist thin film to form a negative tone resist pattern having a circular shape. Further, according to the Experimental Example, it may be confirmed that a resist thin film is formed on the substrate on which the third underlayer (DS-BTOC) is coated, and an extreme ultraviolet lithography process is performed on the resist thin film to form a negative tone resist pattern having a circular shape.

Figure 6:
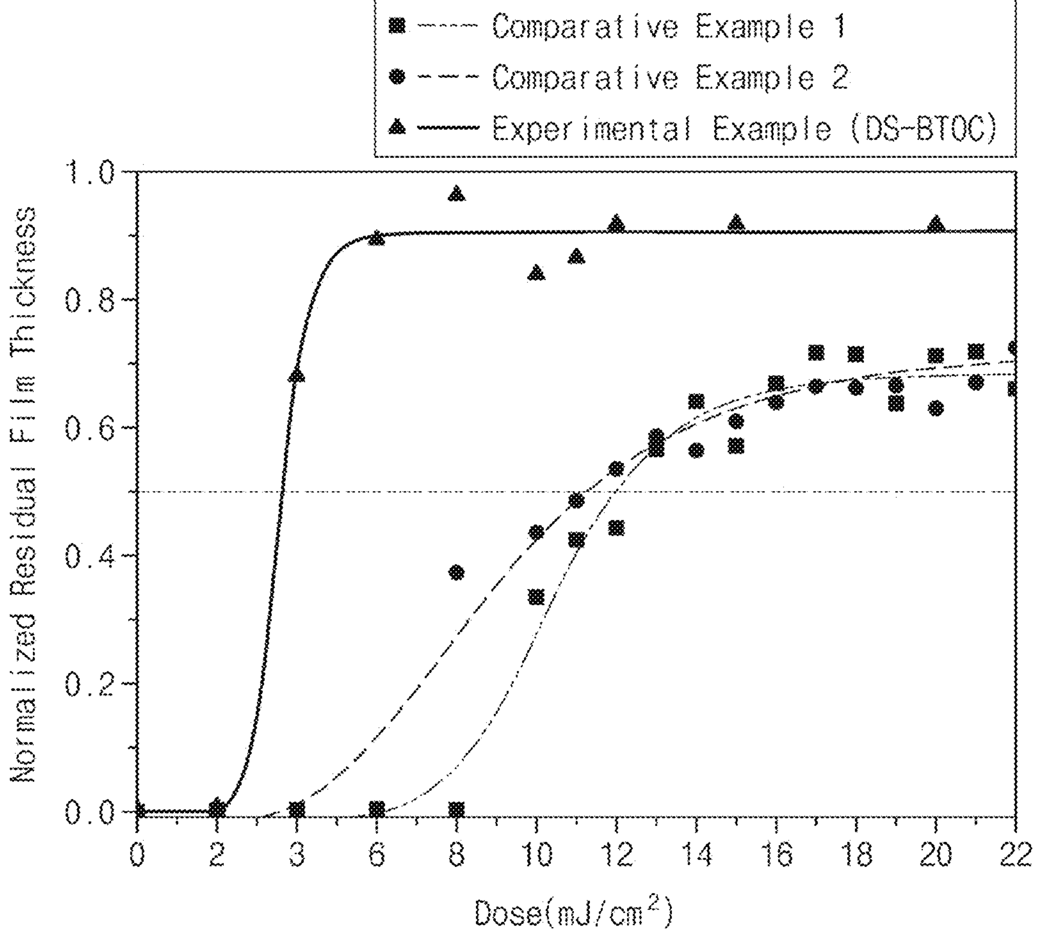
FIG. 6 shows a graph illustrating evaluation results of the solubility of resist thin films according to Experimental Example 2.

FIG. 6 shows a graph illustrating evaluation results of the solubility of resist thin films according to Experimental Example 2.

Referring to FIG. 6, in the case of the substrate on which the first underlayer (VTMS) is coated according to Comparative Example 1, when extreme ultraviolet of about 12.1 $mJ/cm^2$ is irradiated on the resist thin film, the thickness of the resist pattern could be maintained to about 50% of the thickness of the resist thin film. In the case of the substrate on which the second underlayer (polymer compound) is coated according to Comparative Example 2, when extreme ultraviolet of about 11.4 $mJ/cm^2$ is irradiated on the resist thin film, the thickness of the resist pattern could be maintained to about 50% of the thickness of the resist thin film. In the case of the substrate on which the third underlayer (DS-BTOC) is coated according to the Experimental Example, when extreme ultraviolet of about 3.7 mJ/cm$^2$ is irradiated on the resist thin film, the thickness of the resist pattern could be maintained to about 50% of the thickness of the resist thin film.

Figure 7:
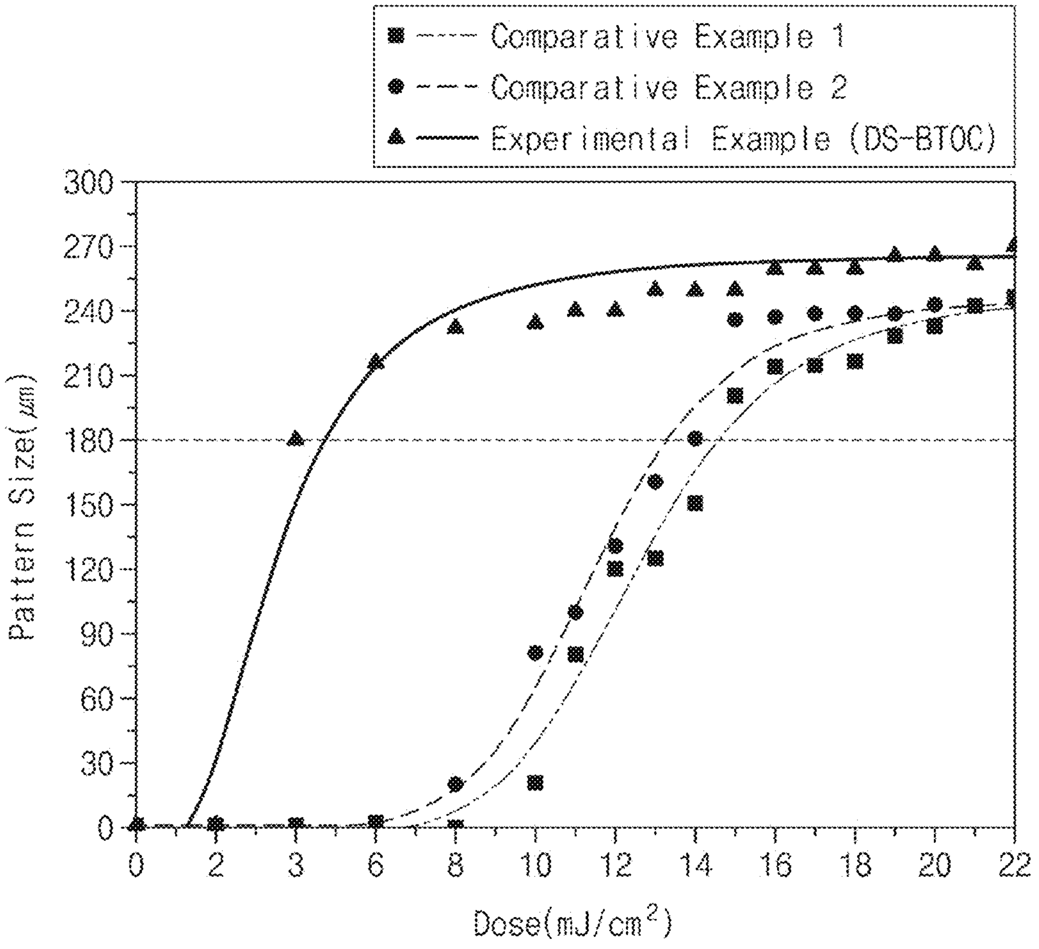
FIG. 7 shows a graph illustrating evaluation results of the size change of resist patterns according to Experimental Example 2.

FIG. 7 shows a graph illustrating evaluation results of the size change of resist patterns according to Experimental Example 2.

Referring to FIG. 7, in the case of the substrate on which the first underlayer (VTMS) is coated according to Comparative Example 1, it could be confirmed that the dosage of about 14.7 mJ/cm$^2$ was consumed for forming the resist pattern (circular) having a longitudinal diameter of about 180 μm. In the case of the substrate on which the second underlayer (polymer compound) is coated according to Comparative Example 2, it could be confirmed that the dosage of about 13.4 mJ/cm$^2$ was consumed for forming the resist pattern (circular) having a longitudinal diameter of about 180 μm. In the case of the substrate on which the third underlayer (DS-BTOC) is coated according to the Experimental Example, it could be confirmed that the dosage of about 4.8 mJ/cm$^2$ was consumed for forming the resist pattern (circular) having a longitudinal diameter of about 180 μm.

A Method for Manufacturing a Semiconductor Device Using an Underlayer Compound According to Embodiments of the Inventive Concept FIG. 8 to FIG. 11 are cross-sectional views showing a method for manufacturing a semiconductor device according to embodiments of the inventive concept.

Figures 8, 9:
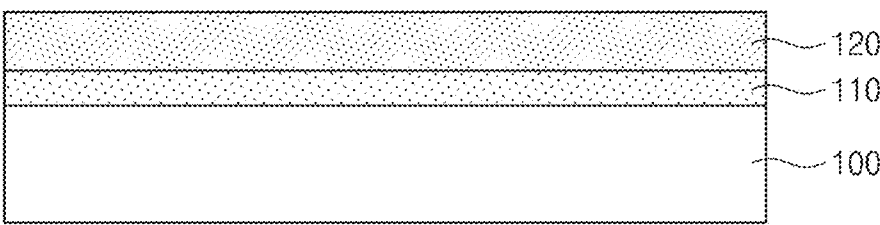
FIG. 8 to FIG. 11 are cross-sectional views showing a method for manufacturing a semiconductor device according to embodiments of the inventive concept.

Referring to FIG. 8, an underlayer 110 may be formed on a lower layer 100, and a photoresist layer 120 may be formed on the underlayer 110. The lower layer 100 may be an etching target layer, and may be formed by any one selected from a semiconductor material, a conductive material, an insulating material, or combinations thereof. The lower layer 100 may be formed as a single layer or may include stacked multiple layers.

The underlayer 110 may include an underlayer compound including an alternating copolymer including a repeating unit represented by Formula 1, or an alkylated tin oxide nanocluster having a counter anion. The alkylated tin oxide nanocluster having the counter anion may have a structure of Formula 5. The formation of the underlayer 110 may include applying the underlayer compound on the lower layer 100. In an embodiment, the applying of the underlayer compound may be performed by a spin coating method.

The photoresist layer 120 may include a resist compound including a fluoroalkyl group. The resist compound may include an alternating copolymer including a repeating unit represented by Formula 4, or a material represented by Formula 8. The formation of the photoresist layer 120 may include applying the resist compound on the underlayer 110 using a fluorine-based solvent. The fluorine-based solvent may include, for example, hydrofluoroether (HFE) and/or perfluorocarbon (PFC). In an embodiment, the applying of the resist compound may include spin coating of the resist compound on the underlayer 110. The formation of the photoresist layer 120 may further include performing heating (for example, a soft baking process) on the resist compound applied.

Referring to FIG. 9, an exposing process may be performed on the photoresist layer 120. The exposing process may include arranging a photomask 130 on the photoresist layer 120, and irradiating light 140 on the photoresist layer 120 through the photomask 130. The light 140 may be electron beam or extreme ultraviolet. The photoresist layer 120 may include a first part 122 exposed to the light 140 and a second part 124 unexposed to the light 140. The light 140 may be irradiated to the first part 122 through an opening 132 of the photomask 130, and may not be irradiated to the second part 124 due to the block by the photomask 130.

A portion of the underlayer 110 may be under the first part 122 of the photoresist layer 120, and the light 140 may be irradiated on the portion of the underlayer 110. The portion of the underlayer 110 may be referred to as an exposed part of the underlayer 110. The other portion of the underlayer 110 may be under the second part 124 of the photoresist layer 120, and the light 140 may be blocked by the photomask 130 so as not to be irradiated on the other portion of the underlayer 110. The other portion of the underlayer 110 may be referred to as an unexposed part of the underlayer 110.

The resist compound may further include radicals produced by the irradiation of the light 140. In an embodiment, the C—F bond of a fluoroalkyl chain in the resist compound may be cleaved by secondary electrons produced by the irradiation of the light 140 to produce carbon radicals. In the first part 122 of the photoresist layer 120, the resist compound may include the radicals (for example, the carbon radicals) produced by the irradiation of the light 140, and materials represented by Formula 4 or Formula 8 may be combined (crosslinked) with each other through the radicals (for example, the carbon radicals). Accordingly, in the first part 122 of the photoresist layer 120, the resist compound may include a crosslinked structure of the materials represented by Formula 4 or Formula 8. In the second part 124 of the photoresist layer 120, the chemical structure of the resist compound may not be changed. As a result, after the exposing process, a solubility difference between the first part 122 and the second part 124 may occur.

The underlayer compound may include a high absorbance element absorbing the light 140 and emitting secondary electrons. The high absorbance element may be, for example, iodine or tin. The high absorbance element in the underlayer compound may absorb the light 140 and emit secondary electrons, and accordingly, the underlayer compound may include the secondary electrons produced by the irradiation of the light 140. The secondary electrons produced in the exposed part of the underlayer 110 may diffuse into the first part 122 of the photoresist layer 120, and accordingly, the crosslinked bond of the resist compound in the first part 122 of the photoresist layer 120 may be promoted. In this case, a dosage required for inducing a solubility difference between the first part 122 and the second part 124 of the photoresist layer 120 may be reduced, and as a result, the sensitivity and resolution of the photoresist layer 120 may be improved.

The underlayer compound may further include radicals produced by the irradiation of the light 140. In an embodiment, the C—H bond of an alkyl chain in the underlayer compound may be cleaved by the secondary electrons produced by the irradiation of the light 140, and due to this, carbon radicals may be produced. The underlayer compound may include the radicals (for example, the carbon radicals) produced by the irradiation of the light 140, and the materials represented by Formula 1 or Formula 5 may be combined (crosslinked) with each other through the radicals (for example, the carbon radicals). Accordingly, the exposed part of the underlayer 110 may include a crosslinked structure of the materials represented by Formula 1 or Formula 5. As a result, the etching resistance of the exposed part of the underlayer 110 may increase.

Further, the underlayer compound may form a crosslinking bond with the resist compound of the first part 122 of the photoresist layer 120 through the radicals (for example, the carbon radicals). Accordingly, the first part 122 of the photoresist layer 120 may be fixed on the underlayer 110 through the chemical bond with the underlayer 110, and the adhesiveness between the first part 122 of the photoresist layer 120 and the underlayer 110 may increase. As a result, the collapse of a photoresist pattern which will be explained later, may be restrained. In this case, an additional heating process (for example, a baking process) for fixing the photoresist layer 120 onto the underlayer 110 may be omitted.

Figure 10:
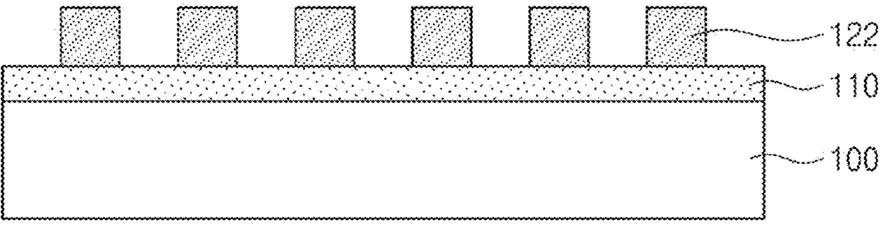

Referring to FIG. 10, after the exposing process, the photomask 130 may be removed. A developing process may be performed on the exposed photoresist layer 120. The developing process may include removing the second part 124 of the photoresist layer 120 by using a fluorine-based developing solution or a dry etching process. The fluorine-based developing solution may include, for example, hydrofluoroether (HFE) and/or perfluorocarbon (PFC). By the developing process, the second part 124 of the photoresist layer 120 may be selectively removed, and the first part 122 of the photoresist layer 120 may be referred to as a photoresist pattern. The photoresist pattern 122 may be a negative tone pattern. In the case that the developing process is performed by using the fluorine-based developing solution having relatively low surface tension, the pattern collapse of the photoresist pattern 122 may be minimized.

Figure 11:
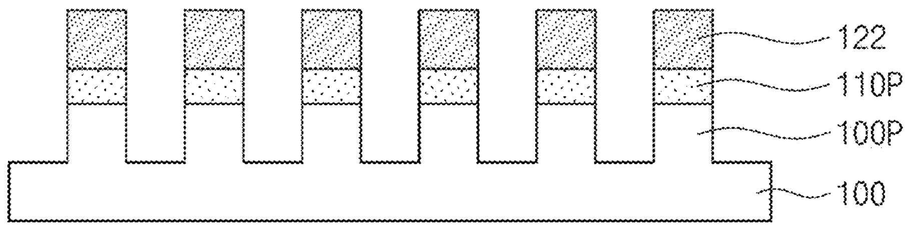

Referring to FIG. 11, the underlayer 110 and the lower layer 100 may be etched using the photoresist pattern 122 as an etching mask. The etching of the underlayer 110 and the lower layer 100 may include, for example, a wet or dry etching process. The underlayer 110 may be etched to form an underlayer pattern 110P, and the upper portion of the lower layer 100 may be etched to form a lower pattern 100P. After forming the lower pattern 100P, the photoresist pattern 122 and the underlayer pattern 110P may be removed. The lower pattern 100P may be a semiconductor pattern, a conductive pattern, or an insulating pattern in a semiconductor device.

A multilayer structure formed using the underlayer compound according to embodiments of the inventive concept will be explained.

According to some embodiments, a multilayer structure may include the lower layer 100, the underlayer 110 and the photoresist layer 120, as explained referring to FIG. 8. The underlayer 110 may include an underlayer compound including an alternating copolymer including a repeating unit represented by Formula 1, or a material represented by Formula 5. The photoresist layer 120 may include a resist compound including a fluoroalkyl group. The resist compound may include an alternating copolymer including a repeating unit represented by Formula 4, or a material represented by Formula 8.

According to some embodiments, the multilayer structure may include the lower layer 100, the underlayer 110 and the photoresist layer 120, as explained referring to FIG. 9. The photoresist layer 120 may include the first part 122 exposed to the light 140, and the second part 124 unexposed to the light 140. In the first part 122 of the photoresist layer 120, the resist compound may include the radicals produced by the irradiation of the light 140, and may include a crosslinked structure of the materials represented by Formula 4 or Formula 8. In the second part 124 of the photoresist layer 120, the chemical structure of the resist compound may not change.

The underlayer 110 may include an exposed part to the light 140 and an unexposed part to the light 140. In the exposed part of the underlayer 140, the underlayer compound may include secondary electrons and radicals produced by the irradiation of the light 140, and may include a crosslinked structure of the materials represented by Formula 1 or Formula 5. Further, the underlayer compound may form a crosslinking bond with the resist compound of the first part 122 of the photoresist layer 120. Accordingly, the first part 122 of the photoresist layer 120 may be fixed onto the underlayer 110 through the chemical bond with the underlayer 110.

According to some embodiments, the multilayer structure may include the lower layer 100, the underlayer 110 and the photoresist pattern 122 as explained referring to FIG. 10. The photoresist pattern 122 is the same as the first part 122 of the photoresist layer 120.

According to the inventive concept, an underlayer may include an underlayer compound including a high absorbance element. The high absorbance element of the underlayer compound may absorb light irradiated by an exposing process and emit secondary electrons. The secondary electrons produced in the exposed part of the underlayer may diffuse into the exposed part of the photoresist layer, and accordingly, the crosslinking bond of the resist compound in the exposed part of the photoresist layer may be promoted. Accordingly, the dosage of the exposing process, required for inducing a solubility difference between the exposed part and the unexposed part of the photoresist layer may be reduced, and as a result, the sensitivity and resolution of the photoresist layer may be improved.

In addition, the underlayer compound may include radicals produced by the light irradiation. In this case, the exposed part of the underlayer may include a crosslinked structure of the materials represented by Formula 1 or Formula 5 through the radicals (for example, the carbon radicals). As a result, the etching resistance of the exposed part of the underlayer may increase.

Further, the underlayer compound may form a crosslinking bond with the resist compound of the exposed part of the photoresist layer through the radicals (for example, the carbon radicals). Accordingly, the exposed part of the photoresist layer may be fixed on the underlayer through the chemical bond with the underlayer, and the adhesiveness between the exposed part of the photoresist layer and the underlayer may increase. As a result, the collapse of the photoresist pattern may be restrained.

Accordingly, an underlayer compound, capable of improving the resolution and sensitivity of the photoresist layer, restraining the collapse of the photoresist pattern, and having improved etching resistance, a multilayer structure formed by using the same, and a method for manufacturing a semiconductor device using the same may be provided.

Although the embodiments of the present invention have been described, it is understood that the present invention should not be limited to the embodiments, but various changes and modifications can be made by one ordinary skilled in the art within the spirit and scope of the present invention as hereinafter claimed.

What is claimed is:

1. An underlayer compound for photolithography, comprising an alternating copolymer including a repeating unit represented by the following Formula 1, or an alkylated tin oxide nanocluster having a counter anion:

[Formula 1]

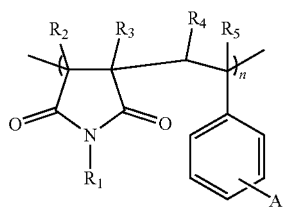

in Formula 1, $R_1$ is an alkyl group of 1 to 18 carbon atoms, $R_2$, $R_3$, $R_4$, and $R_5$ are each independently hydrogen, deuterium, or an alkyl group of 1 to 3 carbon atoms, A is iodine or tin having an alkyl group, and "n" is an integer of 2 to 10,000, wherein the alkylated tin oxide nanocluster comprises a core structure comprising tin oxide, an alkyl group of 1 to 18 carbon atoms, bonded to a tin atom of the core structure, and the counter anion which is an alkylbenzene sulfonate anion.

2. The underlayer compound for photolithography of claim 1, wherein, in Formula 1, A is a functional group represented by the following Formula 2:

[Formula 2]

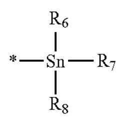

in Formula 2, $R_6$, $R_7$ and $R_8$ are each independently an alkyl group of 1 to 18 carbon atoms, and * is a part combined with carbon of Formula 1.

3. The underlayer compound for photolithography of claim 2, wherein the alternating copolymer includes a repeating unit represented by the following Formula 3:

[Formula 3]

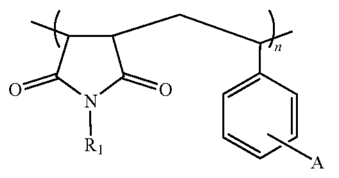

in Formula 3, $R_1$ is an alkyl group of 1 to 18 carbon atoms, A is iodine or a functional group represented by Formula 2, and "n" is an integer of 2 to 10,000.

4. The underlayer compound for photolithography of claim 3, wherein the alternating copolymer includes a repeating unit represented by the following Formula 3-2 or Formula 3-3:

[Formula 3-2]

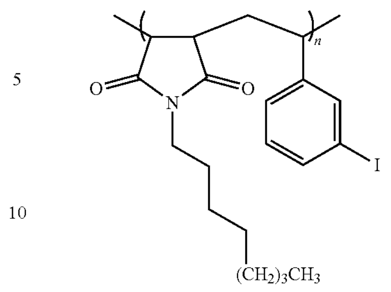

[Formula 3-3]

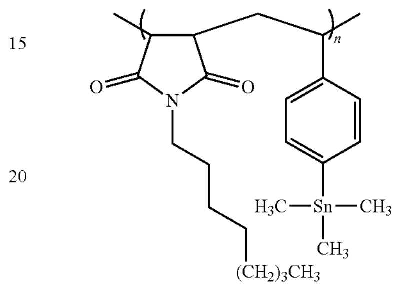

in Formula 3-2 and Formula 3-3, "n" is an integer of 2 to 10,000.

5. The underlayer compound for photolithography of claim 1, wherein the alkylated tin oxide nanocluster having the counter anion comprises a structure of the following Formula 5:

[Formula 5]

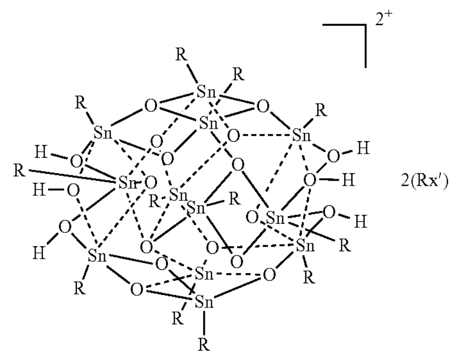

in Formula 5, R is an alkyl group of 1 to 18 carbon atoms, and $R_x^-$ is the counter anion and is the alkylbenzene sulfonate anion.

6. The underlayer compound for photolithography of claim 5, wherein $R_x^-$ has a structure of the following Formula 6:

[Formula 6]

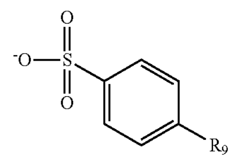

in Formula 6, $R_9$ is an alkyl group of 1 to 18 carbon atoms.

7. The underlayer compound for photolithography of claim 6, wherein $R_9$ has a structure of $—CH_2(CH_2)_{10}CH_3$.

8. The underlayer compound for photolithography of claim 7, wherein R is a butyl group.

9. A multilayered structure comprising:

a lower layer;

an underlayer on the lower layer; and a photoresist layer on the underlayer, wherein the underlayer comprises an alternating copolymer including a repeating unit represented by the following Formula 1, or an alkylated tin oxide nanocluster having a counter anion:

[Formula 1]

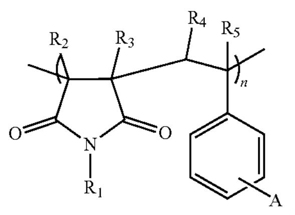

in Formula 1, $R_1$ is an alkyl group of 1 to 18 carbon atoms, $R_2$, $R_3$, $R_4$, and $R_5$ are each independently hydrogen, deuterium, or an alkyl group of 1 to 3 carbon atoms, A is iodine or tin having an alkyl group, and "n" is an integer of 2 to 10,000, wherein the alkylated tin oxide nanocluster comprises a core structure comprising tin oxide, an alkyl group of 1 to 18 carbon atoms, bonded to a tin atom of the core structure, and the counter anion which is an alkylbenzene sulfonate anion.

10. The multilayer structure of claim 9, wherein, in Formula 1, A is a functional group represented by the following Formula 2:

[Formula 2]

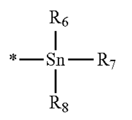

in Formula 2, $R_6$, $R_7$ and $R_8$ are each independently an alkyl group of 1 to 18 carbon atoms, and * is a part combined with carbon of Formula 1.

11. The multilayer structure of claim 9, wherein the alkylated tin oxide nanocluster having the counter anion comprises a structure of the following Formula 5:

[Formula 5]

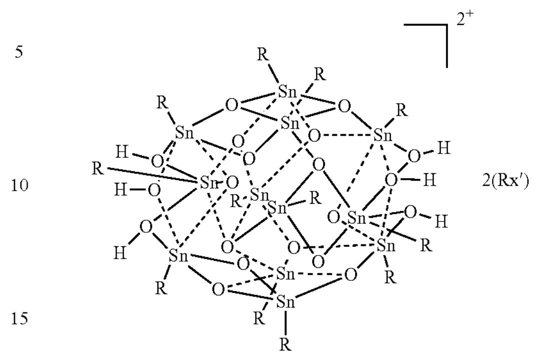

in Formula 5, R is an alkyl group of 1 to 18 carbon atoms, and $R_x^-$ is the counter anion and is the alkylbenzene sulfonate anion.

12. The multilayer structure of claim 11, wherein $R_x^-$ has a structure of the following Formula 6:

[Formula 6]

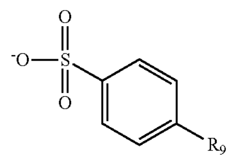

in Formula 6, $R_9$ is an alkyl group of 1 to 18 carbon atoms.

13. The multilayer structure of claim 11, wherein the underlayer includes a crosslinked structure of materials represented by Formula 1 or Formula 5.

14. The multilayer structure of claim 13, wherein the photoresist layer comprises a resist compound including a fluoroalkyl group, and the underlayer includes a structure that the materials represented by Formula 1 or Formula 5 are crosslinked with the resist compound.

15. A method for manufacturing a semiconductor device, the method comprising:

forming an underlayer on a lower layer; and forming a photoresist layer on the underlayer, wherein the forming of the underlayer comprises applying an underlayer compound on the lower layer, the underlayer compound comprising an alternating copolymer including a repeating unit represented by the following Formula 1, or an alkylated tin oxide nanocluster having a counter anion:

[Formula 1]

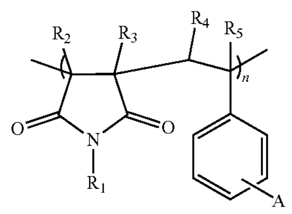

in Formula 1, $R_1$ is an alkyl group of 1 to 18 carbon atoms, $R_2$, $R_3$, $R_4$, and $R_5$ are each independently hydrogen, deuterium, or an alkyl group of 1 to 3 carbon atoms, A is iodine or tin having an alkyl group, and "n" is an integer of 2 to 10,000, wherein the alkylated tin oxide nanocluster comprises a core structure including tin oxide, an alkyl group of 1 to 18 carbon atoms, bonded to a tin atom of the core structure, and the counter anion which is an alkylbenzene sulfonate anion.

16. The method for manufacturing a semiconductor device of claim 15, wherein, the alkylated tin oxide nanocluster having the counter anion comprises a structure of the following Formula 5:

[Formula 5]

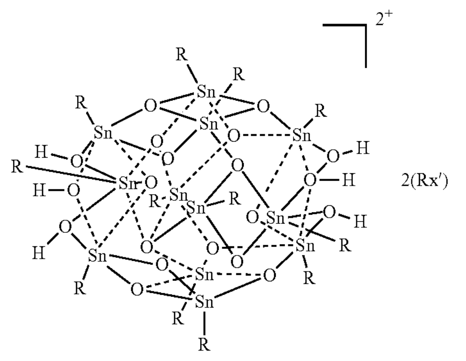

2(Rx')

in Formula 5, R is an alkyl group of 1 to 18 carbon atoms, and $R_x^-$ is the counter anion and is the alkylbenzene sulfonate anion.

17. The method for manufacturing a semiconductor device of claim 16, wherein the forming of the photoresist layer comprises applying a resist compound including a fluoroalkyl group on the underlayer using a fluorine-based solvent.

18. The method for manufacturing a semiconductor device of claim 17, further comprising performing an exposing process on the photoresist layer, wherein the exposing process is performed using electron beam or extreme ultraviolet.

19. The method for manufacturing a semiconductor device of claim 18, wherein the underlayer comprises a crosslinked structure of materials represented by Formula 1 or Formula 5, after the exposing process.

20. The method for manufacturing a semiconductor device of claim 18, wherein the photoresist layer comprises a first part exposed by the exposing process, and a second part unexposed by the exposing process, and The method further comprising:

selectively removing the second part of the photoresist layer by performing a developing process.

* * * * *